(12) United States Patent
Bielefeld et al.

(10) Patent No.: US 10,483,160 B2
(45) Date of Patent: Nov. 19, 2019

(54) ULTRA THIN HELMET DIELECTRIC LAYER FOR MASKLESS AIR GAP AND REPLACEMENT ILD PROCESSES

(71) Applicant: Intel Corporation, Santa Clara, CA (US)

(72) Inventors: Jeffery D. Bielefeld, Forest Grove, OR (US); Manish Chandhok, Beaverton, OR (US); Asad Iqbal, Portland, OR (US); John D. Brooks, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/745,235

(22) PCT Filed: Sep. 23, 2015

(86) PCT No.: PCT/US2015/051767
§ 371 (c)(1),
(2) Date: Jan. 16, 2018

(87) PCT Pub. No.: WO2017/052540
PCT Pub. Date: Mar. 30, 2017

(65) Prior Publication Data
US 2018/0226289 A1    Aug. 9, 2018

(51) Int. Cl.
*H01L 21/768* (2006.01)
*H01L 21/764* (2006.01)
(Continued)

(52) U.S. Cl.
CPC ........ *H01L 21/7682* (2013.01); *H01L 21/764* (2013.01); *H01L 21/76802* (2013.01); *H01L 21/76825* (2013.01); *H01L 21/76826* (2013.01); *H01L 21/76828* (2013.01); *H01L 21/76834* (2013.01); *H01L 23/53295* (2013.01);
(Continued)

(58) Field of Classification Search
CPC ............... H01L 21/7682; H01L 21/764; H01L 21/76802; H01L 21/76825; H01L 21/76826; H01L 21/76828; H01L 21/76834; H01L 21/76885;
(Continued)

(56) References Cited

U.S. PATENT DOCUMENTS 9,343,294 B2 * 5/2016 Chi .................. H01L 23/528
9,859,818 B2 * 1/2018 Verheijden .......... B81C 1/00476
(Continued)

FOREIGN PATENT DOCUMENTS

WO    WO-2013012682    1/2013

OTHER PUBLICATIONS

International Preliminary Search Report for International Patent Application No. PCT/US2015/051767, dated Apr. 5, 2018, 7 pages.
(Continued)

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

A helmet layer is deposited on a plurality of conductive features on a first dielectric layer on a substrate. A second dielectric layer is deposited on a first portion of the helmet layer. An etch stop layer is deposited on a second portion the helmet layer.

20 Claims, 12 Drawing Sheets

(51) Int. Cl.
*H01L 23/532* (2006.01)
*H01L 21/02* (2006.01)
(52) U.S. Cl.
CPC ...... *H01L 21/0217* (2013.01); *H01L 21/0228* (2013.01); *H01L 21/02167* (2013.01); *H01L 21/02274* (2013.01); *H01L 21/76885* (2013.01)
(58) Field of Classification Search
CPC ......... H01L 23/53295; H01L 21/02167; H01L 21/0217; H01L 21/02274; H01L 21/0228
See application file for complete search history.

(56) References Cited

U.S. PATENT DOCUMENTS

| | | |
|---|---|---|
| 2004/0232552 A1 | 11/2004 | Wang et al. |
| 2007/0178713 A1 | 8/2007 | Jeng |
| 2009/0298256 A1 | 12/2009 | Chen et al. |
| 2014/0225251 A1* | 8/2014 | Lee .................. H01L 23/28 257/734 |
| 2014/0252633 A1 | 9/2014 | Tsai et al. |
| 2015/0279780 A1* | 10/2015 | Zhang ................ H01L 21/7681 257/774 |
| 2016/0020140 A1* | 1/2016 | Ryan ................. H01L 21/76802 438/666 |

OTHER PUBLICATIONS

International Search Report and Written Opinion for International Patent Application No. PCT/US2015/051767 dated May 31, 2016, 10 pgs.

\* cited by examiner

ULTRA THIN HELMET DIELECTRIC LAYER FOR MASKLESS AIR GAP AND REPLACEMENT ILD PROCESSES

CROSS-REFERENCE TO RELATED APPLICATION

This patent application is a U.S. National Phase Application under 35 U.S.C. § 371 of International Application No. PCT/US2015/051767, filed Sep. 23, 2015, entitled "ULTRA THIN HELMET DIELECTRIC LAYER FOR MASKLESS AIR GAP AND REPLACEMENT ILD PROCESSES," which designates the United States of America, the entire disclosure of which is hereby incorporated by reference in its entirety and for all purposes.

FIELD

Embodiments as described herein relate to a field of electronic device manufacturing, and in particular, to an integrated circuit manufacturing.

BACKGROUND

Generally, an integrated circuit (IC) refers to a set of electronic devices, e.g., transistors formed on a small chip of semiconductor material, typically, silicon. Typically, an interconnect structure incorporated into the IC includes one or more levels of metal lines to connect the electronic devices of the IC to one another and to external connections. An interlayer dielectric is placed between the metal levels of the IC for insulation. Generally, the efficiency of the interconnect structure depends on the resistance of each metal line and the coupling capacitance generated between the metal lines. Typically, to reduce the resistance and increase the IC performance, copper interconnect structures are used.

As the size of the IC decreases, the spacing between the metal lines decreases. This leads to increase in the coupling capacitance between the metal lines. Increase in the coupling capacitance between the metal lines has a negative impact on signal transmission along metal lines. Furthermore, increase in the coupling capacitance increases energy consumption of the integrated circuit.

One conventional technique to reduce the capacitive coupling between adjacent metal lines involves replacing a high k dielectric material that separates the metal lines with a low k dielectric material. Another conventional technique to reduce the capacitive coupling involves forming an air gap between adjacent metal lines. Each of these techniques, however, requires processing that can damage and extrude the metal lines. Additionally, the conventional technique of replacing a high k dielectric material with a low k dielectric material results in poor adhesion of the dielectric material.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Figure 1A:
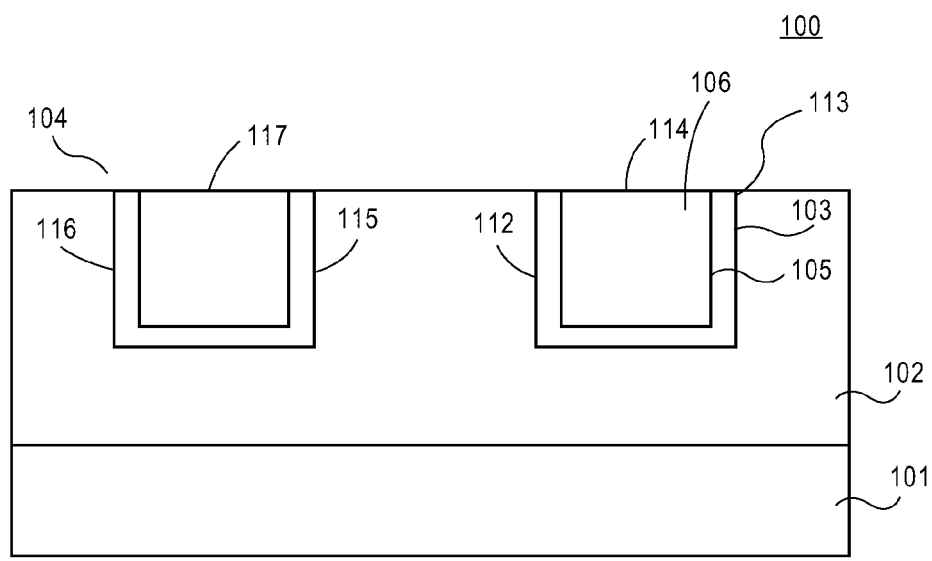
FIG. 1A shows a side view of a portion of an electronic device to integrate an air gap according to one embodiment.

Methods and apparatuses to provide an ultra-thin protection "helmet" layer to protect a conductive feature during a maskless air gap integration process and a replacement interlayer dielectric ILD integration process are described herein. In one embodiment, the ultra-thin helmet layer is used to protect the conductive feature against oxidation, extrusion, or both during a subsequent processing. For conventional air gap process flows, a thick hermetic wrap around etch stop is used on a metal feature. The conventional wrap around etch stop significantly increases capacitance between the metal features. The ultra thin helmet layer integrated into the maskless air gap process as described herein acts only as a temporary protection layer and does not need to be as robust as the final hermetic etch stop layer used in the conventional air gap process. The helmet layer integrated into the maskless air gap process described herein is substantially thinner than the etch stop layer that lowers the capacitance impact comparing with the conventional air gap process. In one embodiment, the thickness of the helmet layer is at least two to four times thinner than that of the conventional etch stop that significantly lowers the capacitance impact, as described in further detail below.

For a conventional replacement ILD process, there is no capping layer on the metal feature. This results in metal damage, extrusion and poor ILD adhesion. The helmet layer integrated in the replacement ILD process described herein protects the metal feature and provide a uniform interface to increase the ILD adhesion, as described in further detail below.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

In one embodiment, a helmet layer is deposited on a plurality of conductive features on a first dielectric layer on a substrate. A second dielectric layer is deposited on a first portion of the helmet layer. An etch stop layer is deposited on a second portion the helmet layer.

FIG. 1A shows a side view 100 of a portion of an electronic device to integrate an air gap according to one embodiment. A plurality of conductive features, such as a conductive feature 103 and a conductive feature 104 are formed on a dielectric layer 102 on a substrate 101. In one embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In another embodiment, substrate 101 represents a previous interconnect layer. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate 101 includes interconnects, for example, vias, configured to connect the metallization layers. In one embodiment, substrate 101 is a semiconductor-on-isolator (SOI) substrate including a hulk lower substrate, a middle insulation layer, and a top monocrystalline layer. The top monocrystalline layer may comprise any material listed above, e.g., silicon.

In various implementations, the substrate 101 can be, e.g., an organic, a ceramic, a glass, a quartz, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, dielectric layer 102 is an interlayer dielectric (ILD) layer. In one embodiment, dielectric layer 102 is an oxide layer, e.g., a silicon oxide layer. In one embodiment, dielectric layer 102 is a low-k dielectric, e.g., silicon dioxide, silicon oxide, carbon doped oxide ("CDO"), or any combination thereof. In one embodiment, dielectric layer 102 includes a nitride, oxide, a polymer, phosphosilicate glass, fluorosilicate ("SiOF") glass, organosilicate glass ("SiOCH"), or any combination thereof. In another embodiment, dielectric layer 102 is a nitride layer, e.g., silicon nitride layer. In alternative embodiments, dielectric layer 102 is an aluminum oxide, silicon oxide nitride, other oxide/nitride layer, any combination thereof, or other electrically insulating layer determined by an electronic device design.

In one embodiment, the thickness of the dielectric layer 102 is determined by design. In one embodiment, the dielectric layer 102 is deposited to the thickness from about 50 nanometers (nm) to about 2 microns (μm). In an embodiment, dielectric layer 102 is deposited on substrate 101 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

As shown in FIG. 1A, conductive features 103 and 104 are formed on dielectric layer 102. Conductive feature 103 comprises a top portion 114 and opposing sidewalls 112 and 113. Conductive feature 104 comprises a top portion 117 and opposing sidewalls 115 and 116. In one embodiment, the conductive features 103 and 104 are conductive lines. In another embodiment, the conductive features 103 and 104 are conductive vias. In alternative embodiments, conductive feature 103 is a line and conductive feature 104 is a via, or vice versa. In one embodiment, conductive features 103 and 104 are formed using one of damascene techniques known to one of ordinary skill in the art of microelectronic device manufacturing.

In the damascene technique, the dielectric layer 102 is patterned to form openings (e.g., trenches) to deposit thereon one or more conductive layers, e.g., a conductive layer 106 and a base layer 105. The one or more conductive layers that overfill the openings are deposited on the dielectric layer 102, and chemical-mechanical polishing (CMP) is used to remove the portions of the one or more conductive layers that extend above the top of the dielectric layer 102. The portions of the one or more conductive layers deposited within the trenches in the dielectric layer 102 are not removed and become the patterned conductive features, such as conductive features 103 and 104. In one embodiment, the size of opening in the dielectric layer 102 is determined by the size of the conductive feature formed later on in the process. In one embodiment, the width of the opening in the dielectric layer is in an approximate range of 0.005 microns ("μm") to 5 μm. In on embodiment, the depth of the opening in the dielectric layer is in the approximate range of 0.005 μm to 10 μm.

In one embodiment, the openings in dielectric layer 102 are formed using the patterning and etching techniques known to one of ordinary skill in the art of microelectronic device manufacturing. A conductive layer, e.g., conductive layer 106 fills the openings in dielectric layer 102 to form the conductive features 103 and 104. In one embodiment, a base layer, e.g., base layer 105 is deposited to cover the internal sidewalls and bottom of the openings in the dielectric layer 102, and then the conductive layer is deposited on the base layer. In one embodiment, the base layer 105 includes a conductive seed layer deposited on a conductive barrier layer. In one embodiment, the seed layer includes copper. In one embodiment, the conductive barrier layer includes aluminum, titanium, titanium nitride, tantalum, tantalum nitride, the like metals, or any combination thereof. Generally, the conductive barrier layer is used to prevent diffusion of the conductive material from the seed layer, e.g., copper, into dielectric layer 102 and to provide adhesion for the seed layer. In one embodiment, to form the base layer, the conductive barrier layer is deposited to cover the sidewalls and bottom of the openings in the dielectric layer 102, and then the seed layer is deposited on the conductive barrier layer. In another embodiment, the conductive base layer includes the seed layer that is directly deposited onto dielectric layer 102 covering the sidewalls and bottom of the openings. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 1 to 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer of copper is deposited onto the seed layer of copper by an electroplating process. In another embodiment, the conductive layer is deposited onto the seed layer using one of selective deposition techniques known to one of ordinary skill in the art of semiconductor manufacturing, e.g., electroplating, electroless plating, or the like techniques. In one embodiment, the choice of a material for the conductive layer 106 determines the choice of a material for the seed layer. For example, if the material for conductive layer 106 includes copper, the material for the seed layer also includes copper. In one embodiment, conductive layer 106 includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the conductive layer 106 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, conductive features 103 and 104 are formed by removing the portions of the conductive layer and the base layer outside the openings in the dielectric layer 102. The portions of the conductive layer may be removed chemically, e.g., using etching, mechanically, e.g., using polishing, or by a combination of thereof techniques, e.g., using a chemical-mechanical polishing ("CMP") technique known to one of ordinary skill in the art of microelectronic device manufacturing. In one embodiment, the conductive features are formed within dielectric layer 102 using methods described above. In another embodiment, the conductive features are formed by patterning and etching of the conductive layer deposited on the top surface of dielectric layer 102 using one of the techniques known to one of ordinary skill in the art of microelectronic device manufacturing.

Figure 1B:
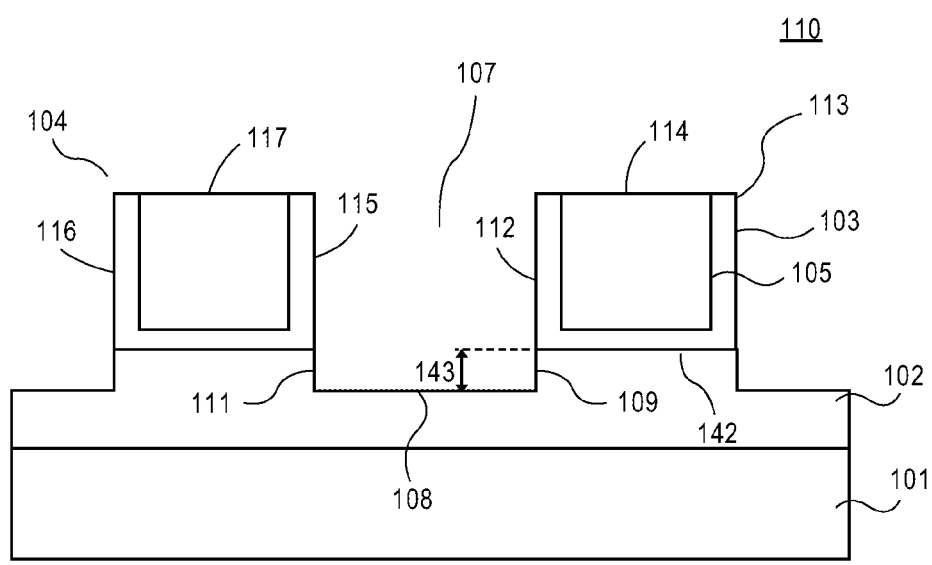
FIG. 1B is a view similar to FIG. 1A after the dielectric layer is recessed to form a trench according to one embodiment.

FIG. 1B is a view 110 similar to FIG. 1A after the dielectric layer 102 is recessed to form a trench 107 according to one embodiment. As shown in FIG. 1B, the dielectric layer 102 is recessed so that the portions of the dielectric layer 102 adjacent to sidewalls of the conductive features 103 and 104 are removed and trench 107 is formed in the dielectric layer 102. Trench 107 has a bottom 108 and opposing sidewalls 109 and 111. Trench 107 has a depth 143. In one embodiment, depth 143 is determined at least in part by the size of an air gap formed later on in a process. In one embodiment, depth 143 is less than about 20 nm.

In one embodiment, the thickness of the conductive feature is from about 0.015 μm to about 1 μm. In one embodiment, the width of the conductive feature is from about 5 nm to about 500 nm. In one embodiment, the spacing between the conductive features 103 and 104 that defines the width of the trench 107 is from about 5 nm to about 500 nm. In more specific embodiment, the spacing between the conductive features 103 and 104 is from about 5 nm to about 50 nm. In one embodiment, the dielectric layer 102 is recessed using one or more patterning and etching techniques known to one of ordinary skill in the art of microelectronic device manufacturing.

Figure 1C:
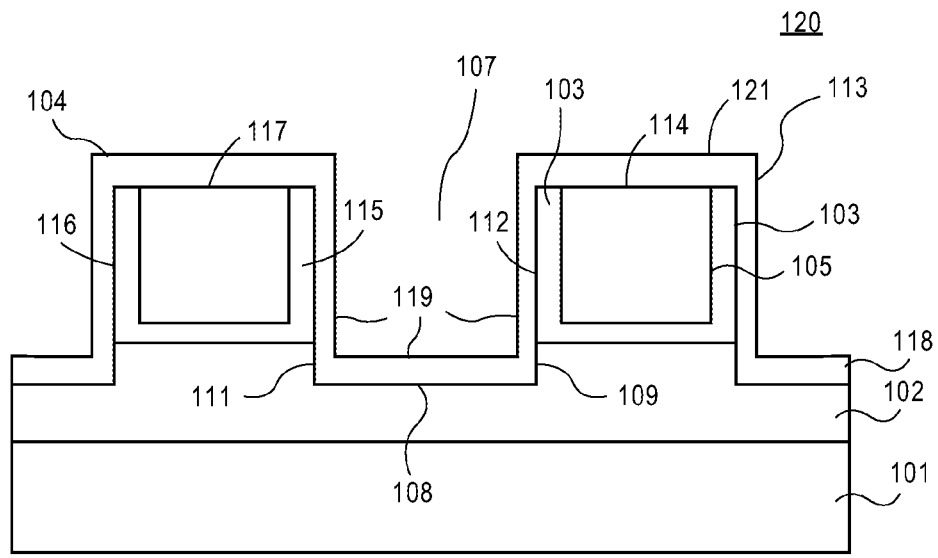
FIG. 1C is a view similar to FIG. 1B after a helmet layer is deposited on the plurality of conductive features according to one embodiment.

FIG. 1C is a view 120 similar to FIG. 1B after a helmet layer 118 is deposited on the plurality of conductive features according to one embodiment. As shown in FIG. 1C, helmet layer 118 is deposited on dielectric layer 102. Helmet layer 118 has portions, such as a portion 121 that coves top portions 114 and 117 of the conductive features 103 and 104. Helmet layer 118 has portions, such as a portion 119 that cover sidewalls 112, 113, 115, and 116 of conductive features 103 and 104 and sidewall portions 111 and 109 and bottom 108 of the trench 107.

In one embodiment, at least one of the material and the thickness of the helmet layer 118 are optimized to prevent the underlying metal features from corrosion and from metal moving (migration) during processing later on in a process. In one embodiment, the helmet layer 118 is to prevent the underlying metal features from corrosion and from metal moving (migration) during processing at a temperature greater than 350 degrees C. In one embodiment, at least one of the material and the thickness of the helmet layer 118 are optimized to increase adhesion with the underlying metal features to prevent the underlying metal features from moving (migration) during processing at a temperature greater than 350 degrees C. later on in a process. In one embodiment, the helmet layer 118 is oxygen free. In one embodiment, the oxygen content in the helmet layer 118 is less than about 5 atomic %. In one embodiment, the helmet layer comprises silicon, carbon, nitride, hydrogen, or any combination thereof. In one embodiment, the helmet layer is a silicon carbide nitride hydrogen (SiCNH) layer. In alternative embodiments, the helmet layer is a silicon carbide nitride hydrogen (SiCNH) layer, a silicon carbide (SiC) layer, a silicon nitride (SiN) layer, or any combination thereof. In one embodiment, the thickness of the helmet layer 118 is less than 5 nm. In one embodiment, the thickness of the helmet layer is from about 2 nm to about 4 nm. In one embodiment, the helmet layer is deposited by a plasma enhanced chemical vapor deposition (PECVD) technique, a plasma enhanced atomic layer deposition (PEALD) technique, or any combination thereof techniques.

Figure 1D:
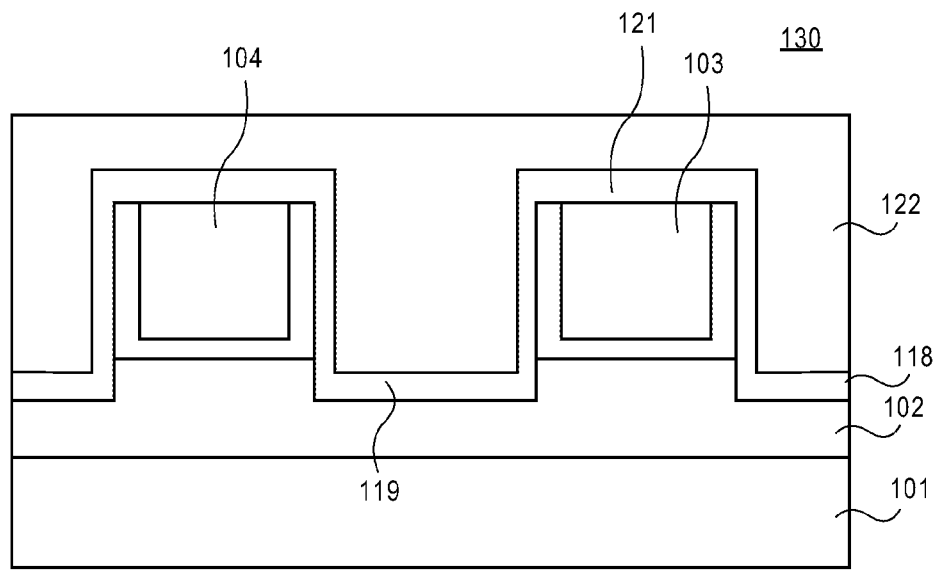
FIG. 1D is a view similar to FIG. 1C after a sacrificial dielectric layer is deposited on the helmet layer according to one embodiment.

FIG. 1D is a view 130 similar to FIG. 1C after a sacrificial dielectric layer is deposited on the helmet layer according to one embodiment. As shown in FIG. 1D, a sacrificial dielectric layer 122 is deposited on helmet layer 118. In one embodiment, sacrificial dielectric layer 122 is a low-k ILD layer. Generally, a low-k dielectric refers to the dielectric having a dielectric constant k less than about 3.9. In one embodiment, sacrificial dielectric layer 122 is an amorphous carbon, a fillable spin-on polymer, e.g., polymethylmethacrylate (PMMA), or other fillable spin-on dielectric. In one embodiment, sacrificial dielectric layer 122 is a titanium nitride (TiN) layer. In alternate embodiments, sacrificial dielectric layer 122 comprises organic materials, inorganic materials, or both. In alternate embodiments, sacrificial dielectric layer 122 is an oxide layer, e.g., a silicon oxide layer (e.g., SiO2), an aluminum oxide (e.g., Al2O3), a carbon doped oxide (e.g., a carbon doped silicon oxide), or a carbon layer. In another embodiment, sacrificial layer 122 is a polymer layer, e.g., a PMMA layer, or other sacrificial polymer layer.

In one embodiment, the thickness of the sacrificial dielectric layer 122 is determined by the size of an air gap formed later on in a process. In one embodiment, the sacrificial dielectric layer 122 is deposited to the thickness from about 20 nm to about 200 nm.

In an embodiment, sacrificial dielectric layer 122 is deposited at a temperature greater than 300 degrees C. During the sacrificial dielectric layer deposition, helmet layer 118 protects underlying conductive features 103 and 104 from oxidation and prevents metal migration from conductive features 103 and 104. In an embodiment, sacrificial dielectric layer 122 is deposited at a temperature between about 300 degrees C. and 400 degrees C. In one embodiment, sacrificial dielectric layer 122 is deposited using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

Figure 1E:
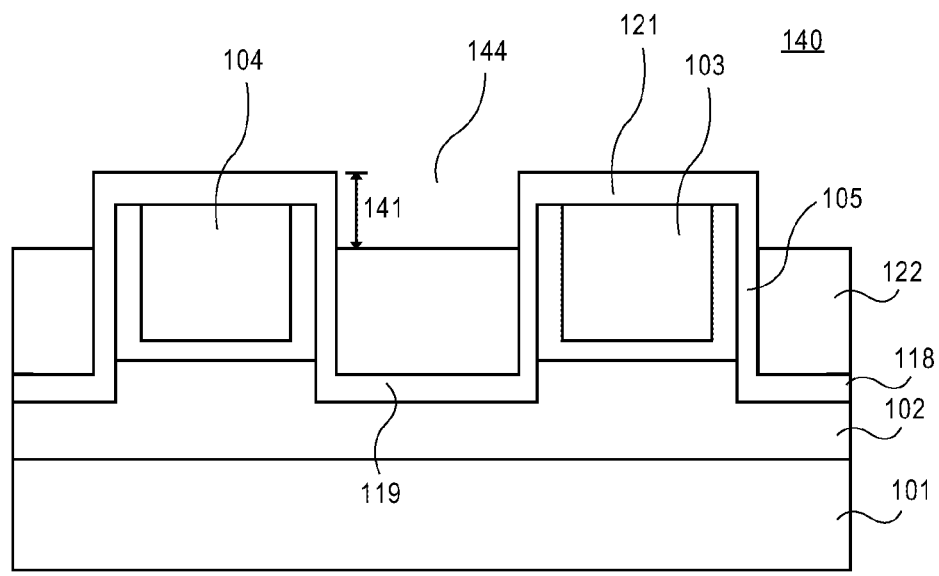
FIG. 1E is a view similar to FIG. 1D after the sacrificial dielectric layer is recessed according to one embodiment.

FIG. 1E is a view 140 similar to FIG. 1D after the sacrificial dielectric layer is recessed according to one embodiment. In one embodiment, the sacrificial dielectric layer 122 is recessed down to a depth 141 to form a trench 144 and expose portions of the helmet layer 118. In one embodiment, the sacrificial dielectric layer 122 is selectively etched down to depth 141 while leaving the protection helmet layer 118 and underlying conductive features 103 and 104 intact. In one embodiment, depth 141 is determined by the thickness of the screen layer deposited on the recessed sacrificial dielectric layer later on in a process. In one embodiment, the sacrificial dielectric layer is recessed using one or more etching techniques e.g., a dry etching, a wet etching, or both etching techniques known to one of ordinary skill in the art of microelectronic device manufacturing.

In another embodiment, sacrificial layer 122 is selectively deposited through a patterned hard mask layer (not shown) to depth 141 onto the device portion shown in FIG. 1C using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing. In one embodiment, the patterned hard mask layer is then removed using one of the hard mask layer removal techniques known to one of ordinary skill in the art of microelectronic device manufacturing.

Figure 1F:
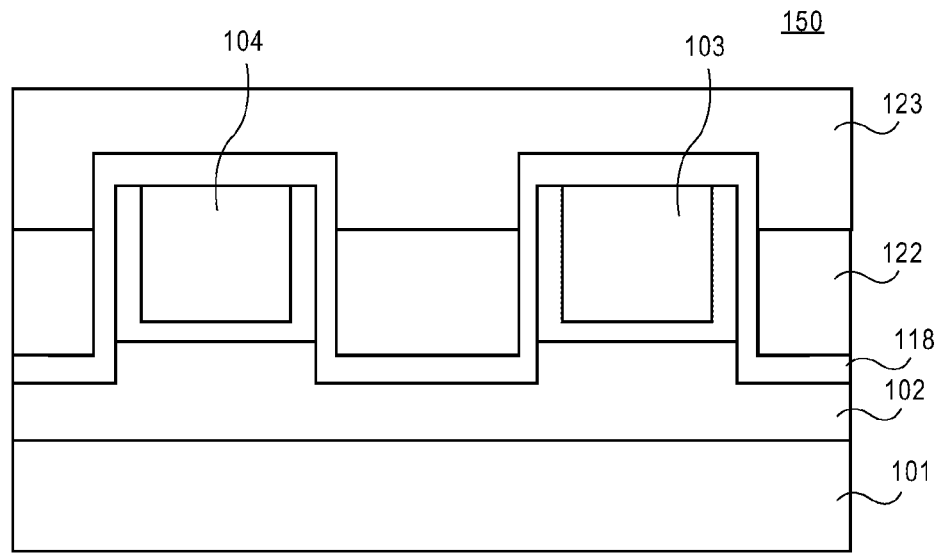
FIG. 1F is a view similar to FIG. 1E after a screen layer is deposited on the recessed sacrificial dielectric layer according to one embodiment.

FIG. 1F is a view 150 similar to FIG. 1E after a screen layer 123 is deposited on the recessed sacrificial dielectric layer 122 according to one embodiment. As shown in FIG. 1F, screen layer 123 is deposited on the exposed portions of the helmet layer 118 and in the trench 144. In one embodiment, the screen layer 123 comprises pores (voids). Generally, porosity refers to a measure of the void (i.e., "empty") spaces over the total volume of the material. In one embodiment the screen layer has a porosity of at least 30%. In more specific embodiment, the porosity of the screen layer is greater than or equal to 50%.

In one embodiment, screen layer 123 comprises silicon and carbon. In one embodiment, screen layer 123 is a silicon carbon oxygen layer. In one embodiment, screen layer 123 is a silicon carbon oxygen hydrogen layer. In one embodiment, screen layer 123 is a porous silicon carbon nitrogen hydrogen layer. In one embodiment, screen layer 123 is an ultra low dielectric constant (k) layer. In one embodiment, screen layer 123 has a dielectric constant k less or equal to 2.2. In another embodiment, screen layer 123 is a high-k dielectric layer having a dielectric constant k greater than that of silicon oxide. In one embodiment, the screen layer 123 is deposited to the thickness to at least flush with the top portions of the conductive features 103 and 104. In one embodiment, the screen layer 123 is thick enough to prevent a misaligned via from breaking into an air gap formed later on in a process. In one embodiment, the thickness of the screen layer is from about 5 nm to about 20 nm.

In an embodiment, screen layer 123 is deposited using one of the Plowable deposition techniques, such as but not limited to a blanket deposition, a spin-on, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

Figure 1G:
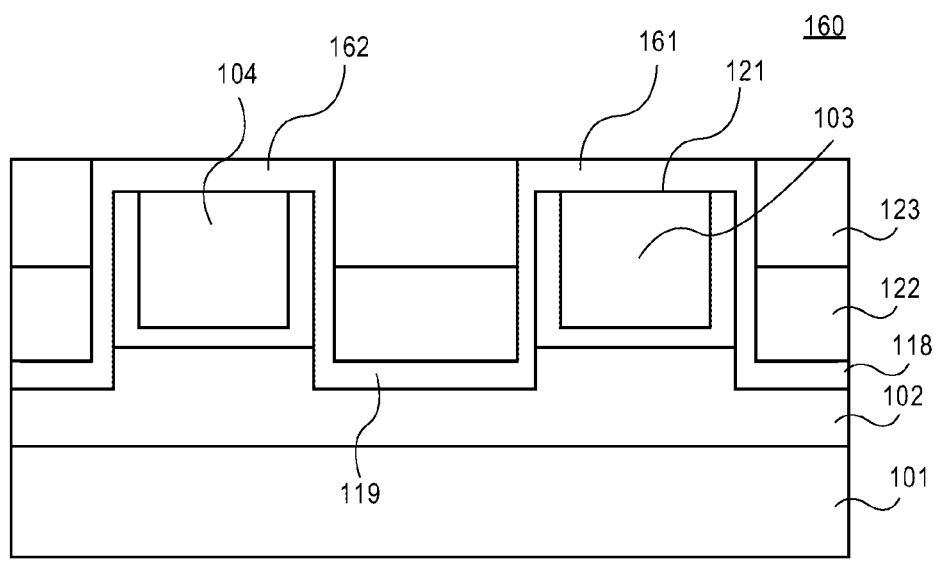
FIG. 1G is a view similar to FIG. 1F after the screen layer is recessed back to expose the top portions of the conductive features according to one embodiment.

FIG. 1G is a view 160 similar to FIG. 1F after the screen layer 123 is recessed back to expose the top portions of the conductive features 103 and 104 according to one embodiment. As shown in FIG. 1G, screen layer 123 is flushed with top portions 161 and 162 of the conductive features 103 and 104. In one embodiment, the screen layer is recessed using one of the CMP techniques known to one of ordinary skill in the art of microelectronic device manufacturing.

Figure 1H:
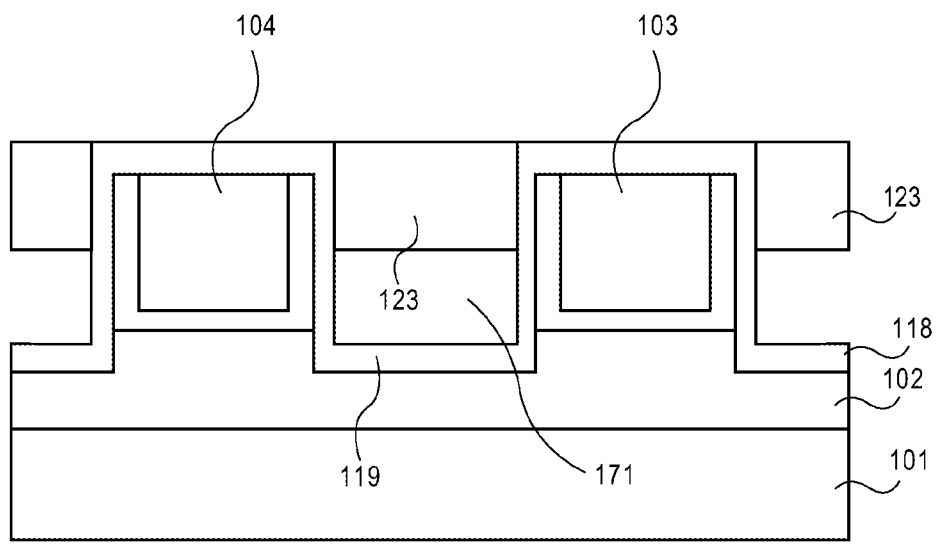
FIG. 1H is a view similar to FIG. 1G after the sacrificial dielectric layer is removed according to one embodiment.

FIG. 1H is a view 170 similar to FIG. 1G after the sacrificial dielectric layer 122 is removed according to one embodiment. As shown in FIG. 1H, sacrificial dielectric layer 122 is removed through the pores of the screen layer 123 to form air gaps, e.g., an air gap 171. Air gap 171 is adjacent to portion 119 of the helmet layer 118. Air gap 171 is underneath the screen layer 123, as shown in FIG. 1H. In one embodiment, sacrificial dielectric layer 122 is outgassed through the pores of the screen layer 123 at a temperature greater than 300 degrees C. In one embodiment, sacrificial dielectric layer 122 is outgassed through the pores of the screen layer 123 at a temperature from about 350 degrees C. to about 450 degrees C. In one embodiment, sacrificial dielectric layer 122 is removed using a plasma assisted ashing process. During the removal of the sacrificial dielectric layer 122, helmet layer 118 advantageously protects underlying conductive features 103 and 104 from oxidation and prevents metal migration from conductive features 103 and 104.

Figure 1I:
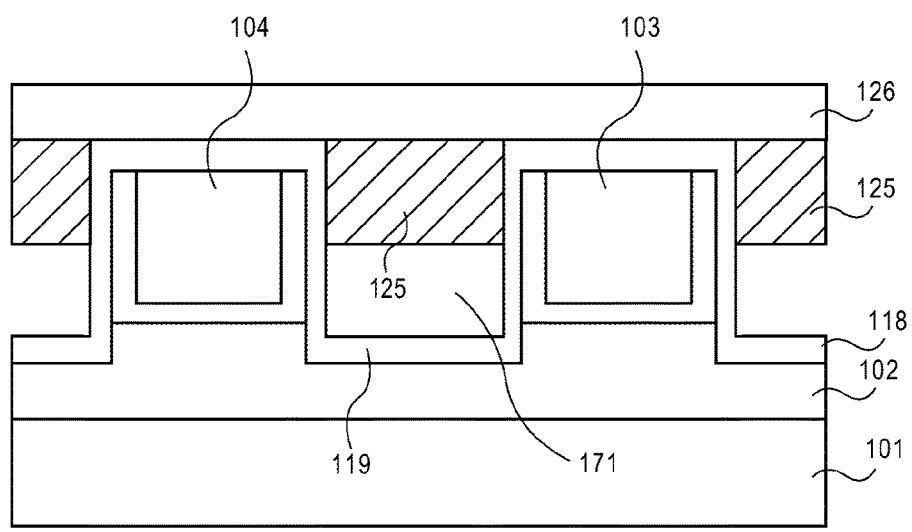
FIG. 1I is a view similar to FIG. 1H after the screen layer is stuffed and a hermetic etch stop layer is deposited on the stuffed screen layer according to one embodiment.

FIG. 1I is a view 180 similar to FIG. 1H after the screen layer is stuffed and a hermetic etch stop layer 126 is deposited on the stuffed screen layer according to one embodiment. As shown in FIG. 1I, porous screen layer 123 is converted to a stuffed screen layer 125, and etch stop layer 126 is deposited on the portions 121 of the helmet layer 118 that covers the top portions of the conductive features 103 and 104 and onto the portions of the stuffed screen layer 125 between the conductive features. In one embodiment, the etch stop layer is deposited on the dense (stuffed) screen layer, to increase hermeticity and mechanical rigidity for a next layer patterning. In one embodiment, the hardness of the stuffed screen layer is greater than that of the unstuffed screen layer. In one embodiment, the screen layer is stuffed to increase a k value to at least 4. In one embodiment, the screen layer is selectively stuffed through a patterned hard mask (not shown), which is removed later on in a process.

In one embodiment, the porous material of the screen layer is stuffed by filling the pores with a stuffant material, curing the porous material, or both. In one embodiment, the stuffant material is deposited onto the screen material using one of deposition techniques (e.g., a spin-on, or other deposition techniques) and then cured to fill the pores of the screen material.

In one embodiment, the stuffant material to fill the pores of the screen layer is a polymer (e.g., PMMA or other polymer), a titanium nitride, aluminum oxide or other stuffant material. In one embodiment, the stuffant material and the screen material are the same materials. In one embodiment, the pores of the screen layer material are re-filled using the second phase of the same material. In one embodiment, the pores of the screen layer are filled with the polymer stuffant at a temperature greater than a room temperature. In one embodiment, the porous screen layer is cured using an electron beam curing, a ultraviolet (UV) light curing, annealing, or any combination thereof. In one embodiment, the screen layer is stuffed at a temperature of at least 400 degrees C. In one embodiment, helmet layer 118 protects underlying conductive features 103 and 104 from oxidation and prevents metal migration from conductive features 103 and 104 during the stuffing of the screen layer. In one embodiment, the etch stop layer 126 is a silicon nitride layer, a silicon carbide layer, a silicon carbide nitride layer, a silicon carbide oxide layer, a silicon carbide nitride hydrogen layer, or a combination thereof. In one embodiment, etch stop layer 126 comprises silicon (Si), carbon (C), nitrogen (N), oxygen (O), hydrogen (H), or any combination thereof. In one embodiment, etch stop layer 126 is a SiC-NOH layer. In one embodiment, etch stop layer 126 is a carbon doped silicon oxide nitride (SiON:C) layer. In one embodiment, etch stop layer 126 is a high-k dielectric layer having a dielectric constant k greater than that of silicon oxide.

In alternate embodiments, etch stop layer 126 is an oxide layer, e.g., a silicon oxide layer, a carbon doped silicon oxide, a fluorine-doped silicon oxide, a metal oxide, e.g., a titanium oxide, an aluminum oxide, or any other metal oxide; a hydrogensilesquioxane, a fluorine-doped silicon oxide, a fluorinated amorphous carbon, a methylsesquioxane (MSQ), a nitride layer, e.g., a silicon nitride, a titanium nitride, a silicon oxide nitride, silicon carbide, or other etch stop layer. In one embodiment, the thickness of the etch stop layer 116 is from about 5 nm to about 20 nm.

In an embodiment, etch stop layer 126 is deposited using one of deposition techniques, such as but not limited to a blanket deposition, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

Figure 1J:
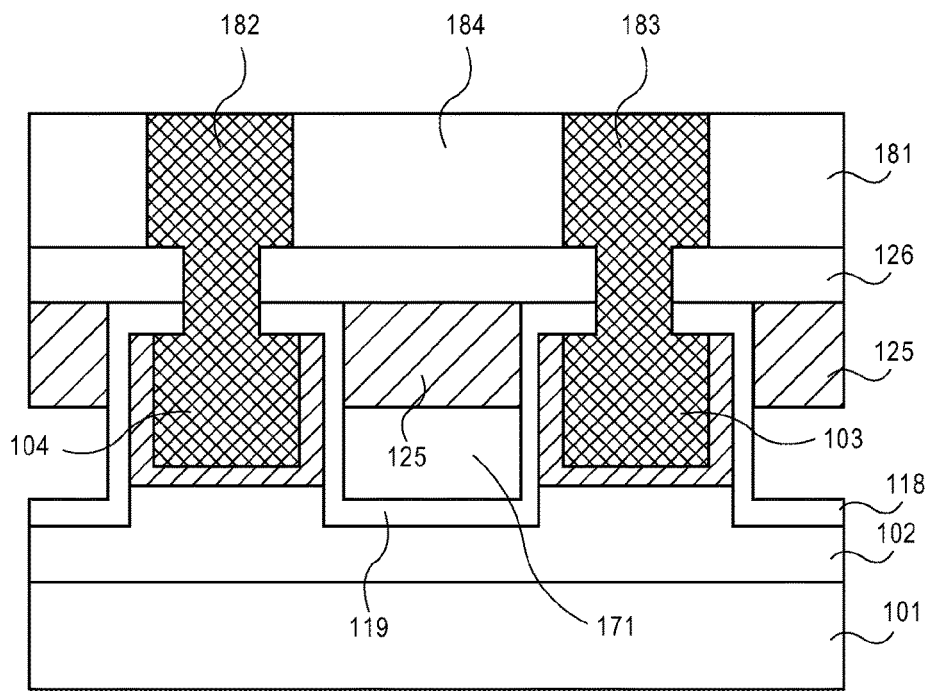
FIG. 1J is a view similar to FIG. 1I after a next interconnect layer is formed according to one embodiment.

FIG. 1J is a view 190 similar to FIG. 1I after a next interconnect layer 181 is formed according to one embodiment. In one embodiment, the next interconnect layer 181 comprises an insulating layer 184 deposited on the etch stop layer 126. In an embodiment, insulating layer 184 is an interlayer dielectric (ILD) layer. In one embodiment, insulating layer 184 is an oxide layer, e.g., a silicon oxide layer. In another embodiment, insulating layer 184 is a nitride layer, e.g., silicon nitride layer. In alternative embodiments, insulating layer 184 is an aluminum oxide, silicon oxide nitride, other oxide/nitride layer, any combination thereof, or other electrically insulating layer determined by an electronic device design. Interconnects 182 and 184 are formed through insulating layer 184, etch stop layer 126 and stuffed screen layer 125 on contact features 104 and 103 respectively. In one embodiment, interconnects 182 and 183 comprise conductive vias, or any other conductive interconnects. In one embodiment, the next interconnect layer 181 is formed using a BEOL processing known to one of ordinary skill in the art of microelectronic device manufacturing.

For conventional techniques, when conductive vias formed in an upper interconnect layer are misaligned with respect to conductive lines in the lower layer and land in an air gap, such misaligned vias reduce shorting margin and can short adjacent lines. Unlike conventional techniques, the etch stop layer on the stuffed screen layer described herein prevent the misaligned vias from breaking into the air gap so that a short circuit cannot be created between the adjacent conductive lines.

Figure 2A:
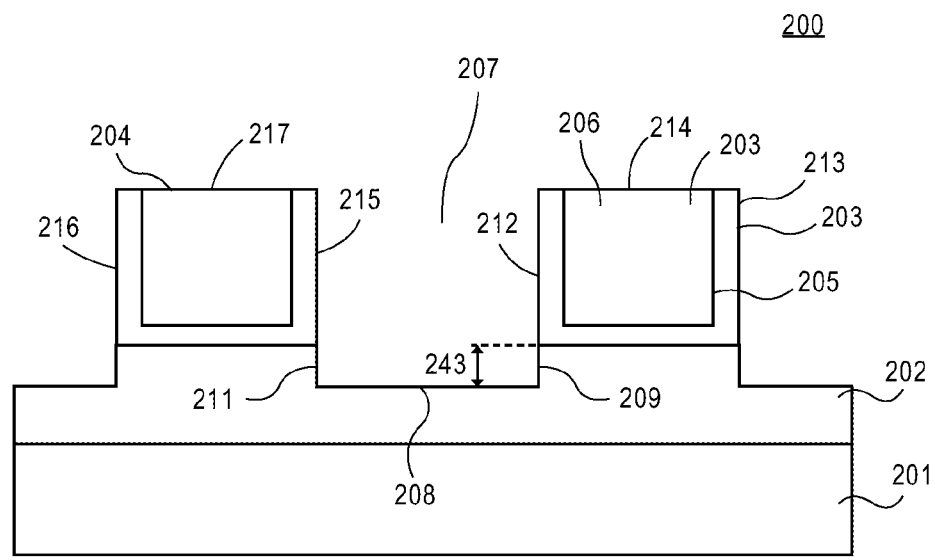
FIG. 2A is a side view of a portion of an electronic device to integrate a replacement interlayer dielectric according to another embodiment.

FIG. 2A is a side view 200 of a portion of an electronic device to integrate a replacement interlayer dielectric according to another embodiment. FIG. 2A is similar to FIG. 1B. As shown in FIG. 2A, a plurality of conductive features, such as a conductive feature 203 and a conductive feature 204 are formed on a dielectric layer 202 on a substrate 201. Conductive feature 203 comprises a top portion 214 and opposing sidewalls 212 and 213. Conductive feature 204 comprises a top portion 217 and opposing sidewalls 215 and 216. Conductive feature 203 comprises one or more conductive layers, e.g., a conductive layer 206 on a base layer 205. Conductive layer 206 and base layer 205 represent the conductive layer 106 and base layer 105 respectively. Dielectric layer 202 represents dielectric layer 102. Substrate 201 represents substrate 101. Conductive features 203 and 204 represent conductive features 103 and 104 respectively.

As shown in FIG. 2A, the dielectric layer 202 is recessed so that the portions of the dielectric layer 202 adjacent to sidewalls of the conductive features 203 and 204 are removed and trench 207 is formed in the dielectric layer 202. Trench 207 has a bottom 208 and opposing sidewalls 209 and 211. In one embodiment, a depth 243 of the trench 207 is determined at least in part by the thickness of the replacement interlayer dielectric (ILD) layer formed later on in a process. In one embodiment, the depth 243 of the trench 207 is less than about 20 nm.

Figure 2B:
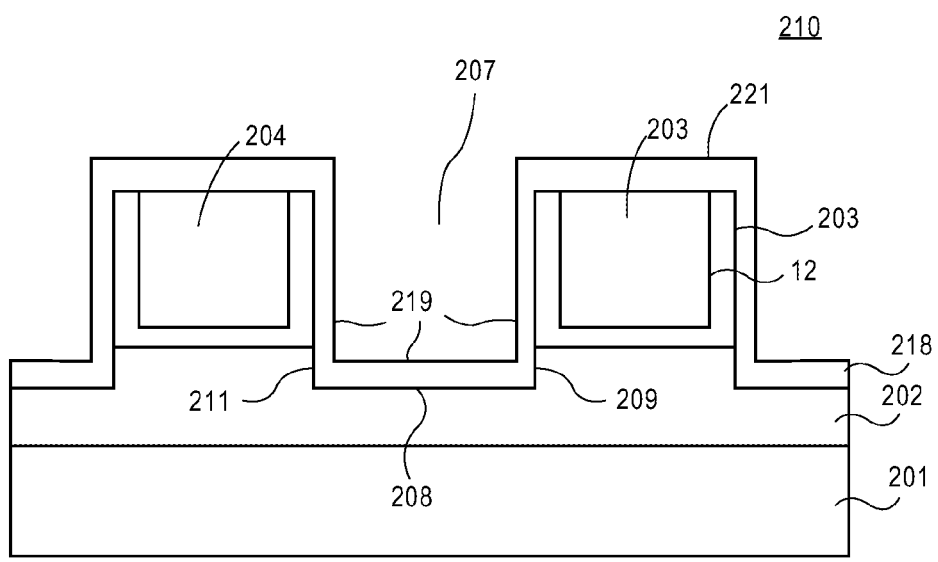
FIG. 2B is a view similar to FIG. 2A after a helmet layer is deposited on the plurality of conductive features according to another embodiment.

FIG. 2B is a view 210 similar to FIG. 2A after a helmet layer 218 is deposited on the plurality of conductive features according to another embodiment. Helmet layer 218 has portions, such as a portion 221 that cover top portions 214 and 217 of the conductive features 203 and 204. Helmet layer 218 has portions, such as a portion 219 that cover sidewalls 212, 213, 215, and 216 of conductive features 203 and 204 and sidewall portions 211 and 209 and bottom 208 of the trench 207. In one embodiment, helmet layer 218 represents helmet layer 118.

In one embodiment, at least one of the materials and the thickness of the helmet layer 218 are optimized to prevent the underlying metal features from corrosion and from metal moving (migration) during processing later on in a process. In one embodiment, the helmet layer 218 is to increase to prevent the underlying metal features from moving (migration) during processing at a temperature greater than 350 degrees C. later on in a process. In one embodiment, helmet layer 218 is deposited to increase adhesion of the underlying metal features with a replacement ILD deposited later on in a process. In one embodiment, the helmet layer 218 is oxygen free. In one embodiment, the oxygen content in the helmet layer 218 is less than about 5 atomic %. In one embodiment, the helmet layer comprises silicon, carbon, nitride, hydrogen, or any combination thereof. In one embodiment, the helmet layer is a silicon carbide nitride hydrogen (SiCNH) layer. In alternative embodiments, the helmet layer is a silicon carbide nitride hydrogen (SiCNH) layer, a silicon carbide (SiC) layer, a silicon nitride (SiN) layer, or any combination thereof. In one embodiment, the thickness of the helmet layer 218 is less than 5 nm. In one embodiment, the thickness of the helmet layer is from about 2 nm to about 4 nm. In one embodiment, the helmet layer is deposited by a plasma enhanced chemical vapor deposition (PECVD) technique, a plasma enhanced atomic layer deposition (PEALD) technique, or any combination thereof techniques.

Figure 2C:
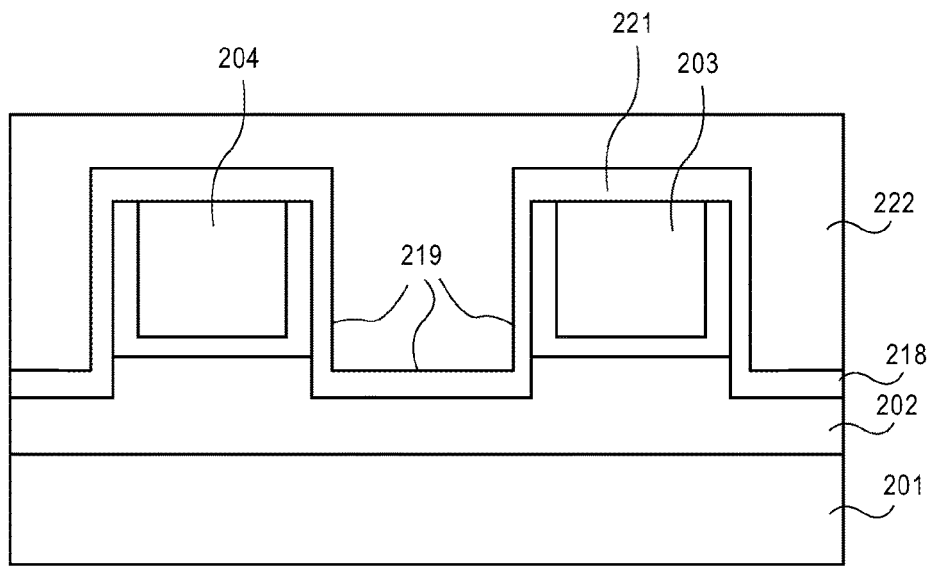
FIG. 2C is a view similar to FIG. 2B after a replacement ILD layer is deposited on the helmet layer according to another embodiment.

FIG. 2C is a view 220 similar to FIG. 2B after a replacement ILD layer is deposited on the helmet layer according to another embodiment. As shown in FIG. 2C, a replacement ILD 222 is deposited on the helmet layer 218. In one embodiment, replacement ILD 222 is a low-k ILD layer.

In one embodiment, replacement ILD 222 comprises pores. In one embodiment, replacement ILD 222 comprises silicon and carbon. In one embodiment, replacement ILD 222 is a silicon carbon oxygen layer. In one embodiment, replacement ILD 222 is a silicon carbon oxygen hydrogen layer. In one embodiment, replacement ILD 222 is a low dielectric constant (k) layer having a dielectric constant k less or equal to 2.85. In one embodiment, replacement ILD 222 is an ultra low k layer having a dielectric constant k less or equal to 2.1

In alternate embodiments, replacement ILD 222 comprises organic materials, inorganic materials, or both. In alternate embodiments, replacement ILD 222 is an oxide layer, e.g., a silicon oxide layer (e.g., SiO2), an aluminum oxide (e.g., Al2O3), a carbon doped oxide (e.g., a carbon doped silicon oxide), or a low k polymer layer. In one embodiment, the replacement ILD 222 is deposited to the thickness from about 50 nanometers (nm) to about 200 nm. In one embodiment, replacement ILD 222 is deposited using one of the flowable deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

In one embodiment, the replacement ILD is cured to increase a k value. In an embodiment, replacement ILD 222 is cured to increase mechanical rigidity. In one embodiment, the density of the replacement ILD layer is increased by curing. During curing of the replacement ILD, helmet layer 218 protects underlying conductive features 203 and 204 from oxidation and prevents metal migration from conductive features 203 and 204. In one embodiment, the replacement ILD is cured at a temperature greater than 300 degrees C. In an embodiment, replacement ILD 222 is cured at a temperature between about 300 degrees C. and 400 degrees C. In alternative embodiments, the replacement ILD layer is cured using an electron beam curing, a ultraviolet (UV) light curing, annealing, or any combination thereof.

Figure 2D:
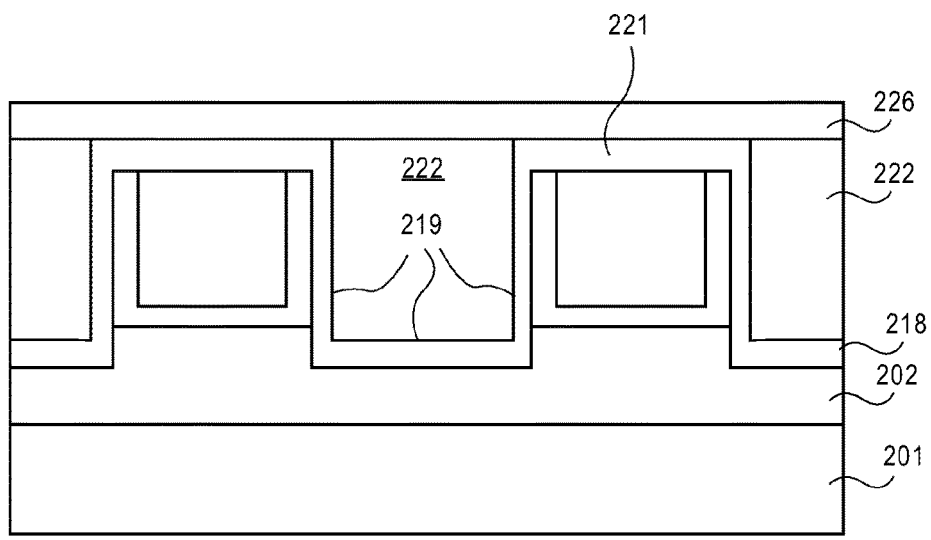
FIG. 2D is a view similar to FIG. 2C after an etch stop layer is deposited on the replacement ILD according to another embodiment.

FIG. 2D is a view 230 similar to FIG. 2C after an etch stop layer 226 is deposited on the replacement ILD according to another embodiment. As shown in FIG. 2D, the replacement ILD 222 is recessed back to flush with the top portions of conductive features 203 and 204. In one embodiment, the replacement ILD layer is recessed using one of the CMP techniques known to one of ordinary skill in the art of microelectronic device manufacturing. The etch stop layer 226 is deposited on the top portions of the conductive features 103 and 104 and the portions of the recessed ILD layer 222 adjacent to the conductive features. In one embodiment, etch stop layer 226 represents the etch stop layer 126.

Figure 2E:
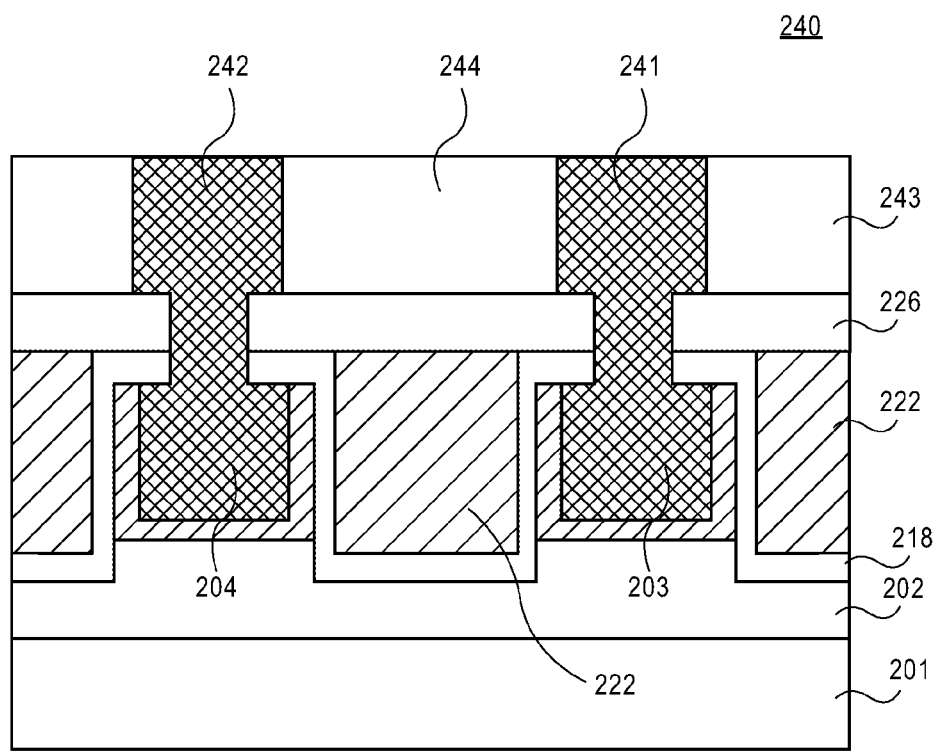
FIG. 2E is a view similar to FIG. 2D after a next interconnect layer is formed according to another embodiment.

FIG. 2E is a view 240 similar to FIG. 2D after a next interconnect layer 243 is formed according to another embodiment. In one embodiment, the next interconnect layer 243 comprises an insulating layer 244 deposited on the etch stop layer 226. In one embodiment, insulating layer 244 is similar to replacement ILD layer 222. In another embodiment, insulating layer 244 is different from replacement ILD layer 222. In one embodiment, insulating layer 244 represents insulating layer 184. Interconnects 241 and 242 are formed through insulating layer 243, etch stop layer 226 on contact features 204 and 203 respectively. In one embodiment, interconnects 241 and 242 represent interconnects 182 and 183.

Figure 3:
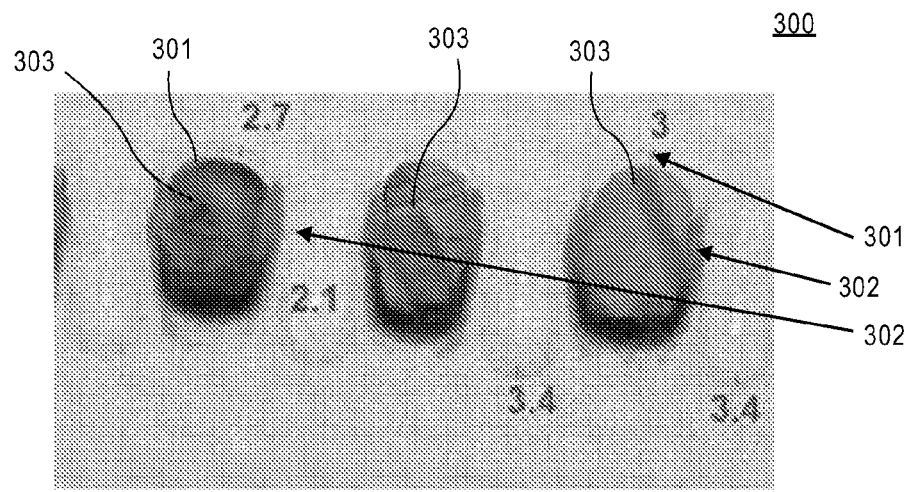
FIG. 3 is a view showing a transmission electron microscope (TEM) image of a portion of an electronic device structure comprising a helmet layer deposited on copper features on a dielectric layer according to one embodiment.

FIG. 3 is a view 300 showing a transmission electron microscope (TEM) image of a portion of an electronic device structure comprising a helmet layer deposited on copper features on a dielectric layer according to one embodiment. As shown in FIG. 3, the thickness of the helmet layer deposited on copper features 303 is substantially minimized. The portions 301 of the helmet layer deposited on top portions of the copper features have thicknesses from about 2.7 to about 3 nm. The portions 302 of the helmet layer deposited on the sidewalls of the copper features have thicknesses from about 2 nm to about 2.1 nm.

Figure 4:
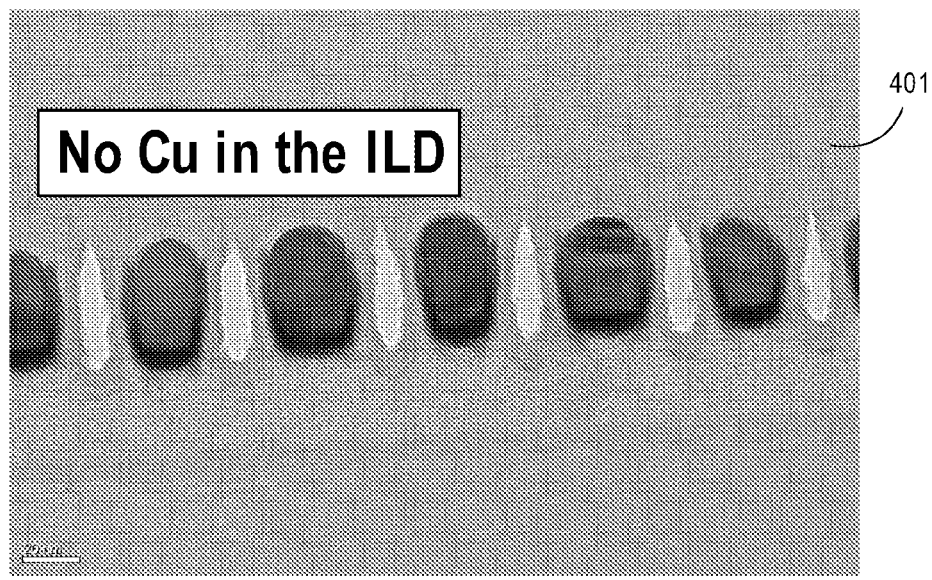
FIG. 4 is a view showing a TEM image of a portion of an electronic device structure after depositing and annealing of a thick SiN layer on a helmet layer on copper features on an ILD layer according to one embodiment.

FIG. 4 is a view 400 showing a TEM image 401 of a portion of an electronic device structure after depositing and annealing of a thick SiN layer on a helmet layer on copper features on an ILD layer according to one embodiment. In this embodiment, the thick SiN layer is deposited at about 400 degrees C., and then annealed in vacuum during about 15 minutes. As shown in FIG. 4, the helmet layer protects the copper features during depositing and annealing of the SiN layer, such that copper does not migrate into the ILD layer.

Figure 5:
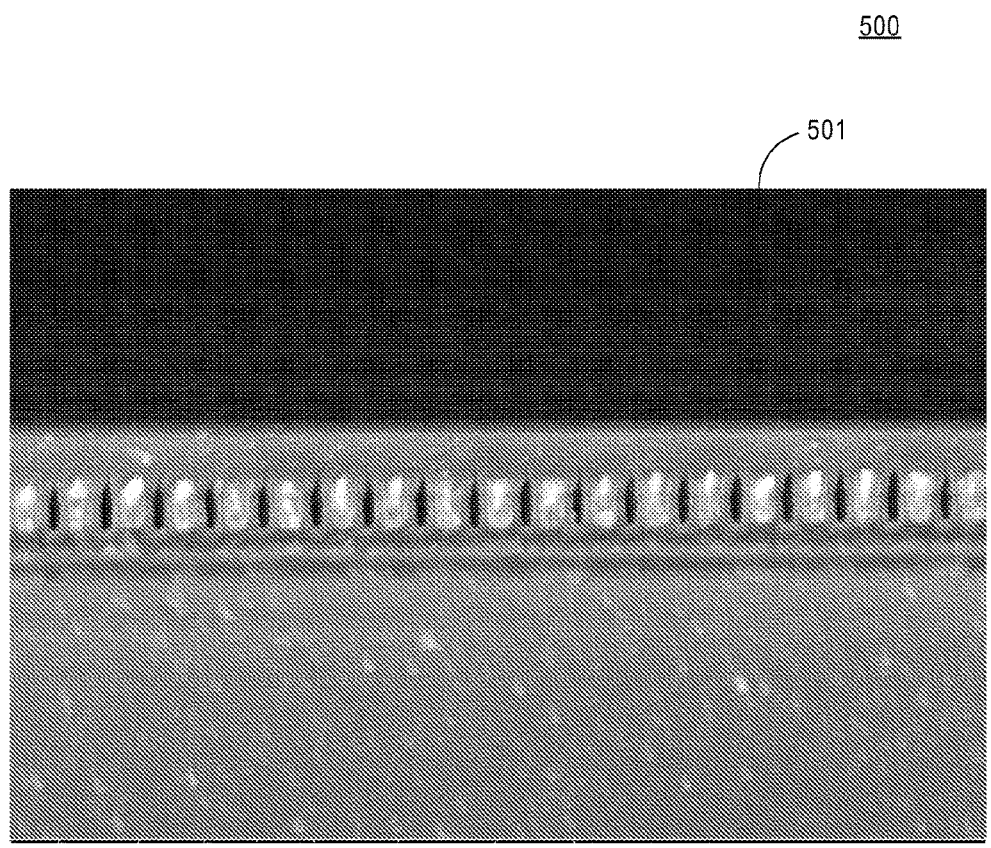
FIG. 5 is a view showing a TEM image of a portion of an electronic device structure after curing a porous screen layer over an air gap on a helmet layer on copper features according to one embodiment.

FIG. 5 is a view 500 showing a TEM image 501 of a portion of an electronic device structure after curing a porous screen layer over an air gap on a helmet layer on copper features according to one embodiment. As shown in FIG. 5, the helmet layer prevents migration of copper from the copper features.

Figure 6:
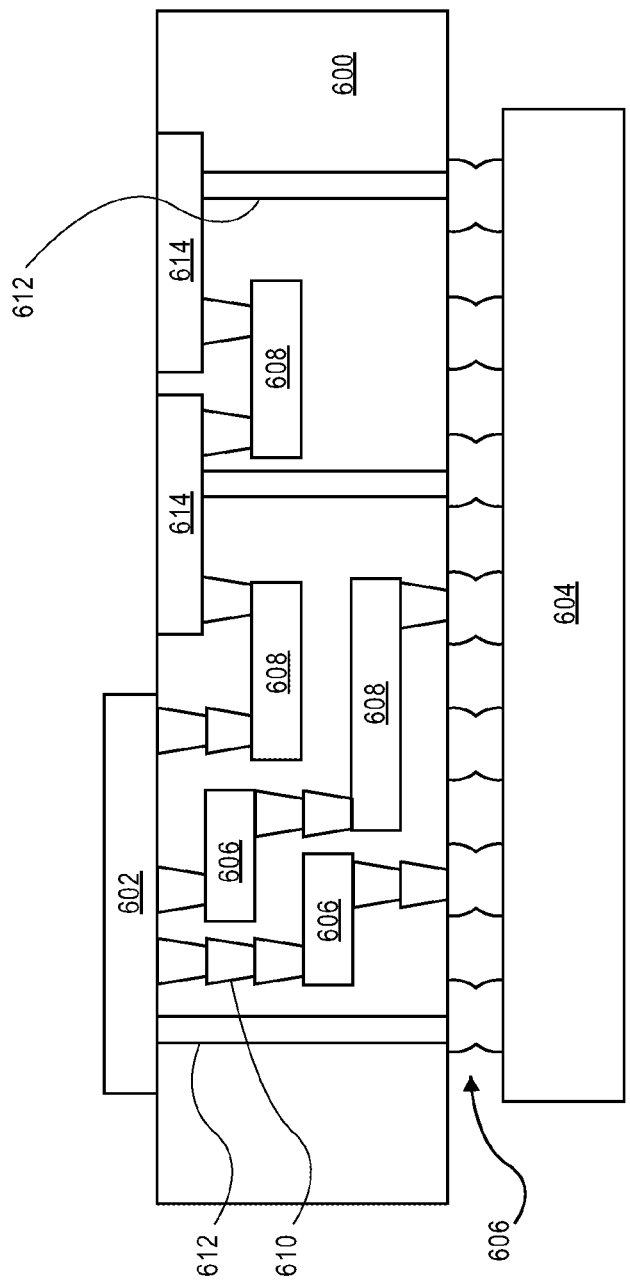
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including passive and active devices. Such devices include, but are not limited to, transistors, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Figure 7:
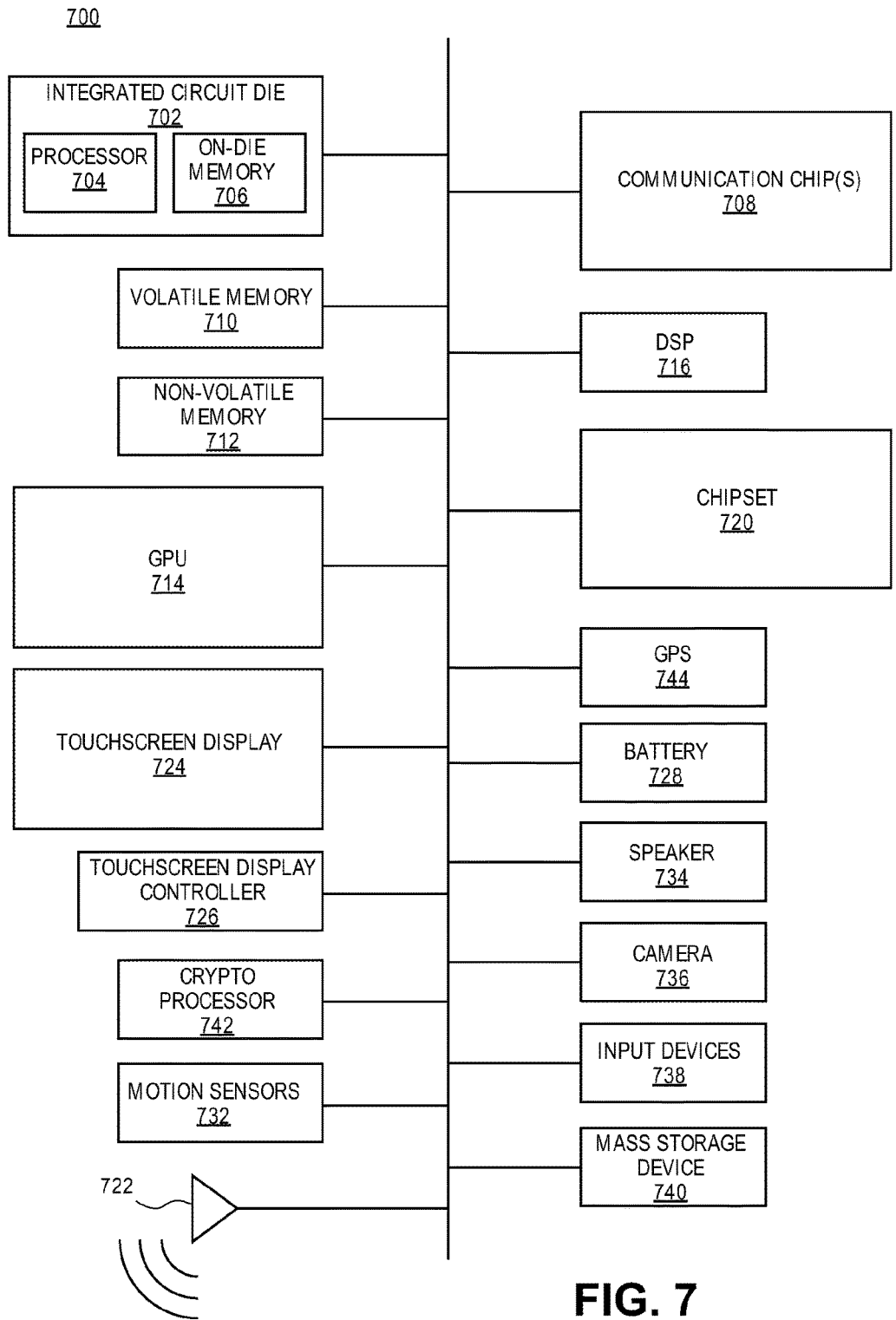
FIG. 7 illustrates a computing device in accordance with one embodiment of the invention.

FIG. 7 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a processor 704 such as a central processing unit (CPU), an on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, a volatile memory 710 (e.g., DRAM), a non-volatile memory 712 (e.g., ROM or flash memory), a graphics processing unit 714 (GPU), a digital signal processor 716 (DSP), a crypto processor 742 (a specialized processor that executes cryptographic algorithms within hardware), a chipset 720, an antenna 722, a display or a touchscreen display 724, a touchscreen display controller 726, a battery 728 or other power source, a global positioning system (UPS) device 744, a power amplifier (PA), a compass, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as a hard disk drive, compact disk (CD), digital versatile disk (DVD), and so forth).

The communication chip 708 enables wireless communications for the transfer of data to and from the computing device 700. The team "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 702, communication chip 708, GPU 714, cryptoprocessor 742, DSP 716, chipset 720, and other components may include one or more devices formed in accordance with embodiments of the invention. In further embodiments, another component housed within the computing device 700 may contain one or more devices formed in accordance with embodiments of the invention.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a method to manufacture an electronic device comprises depositing a helmet layer on a plurality of conductive features on a first dielectric layer on a substrate; depositing a second dielectric layer on a first portion of the helmet layer; and depositing an etch stop layer on a second portion the helmet layer.

In one embodiment, a method to manufacture an electronic device comprises forming a trench in a first dielectric layer between at least two of conductive features on a first dielectric layer on a substrate; depositing a helmet layer on the trench and on a top portion and opposing sidewalls of the at least two of the conductive features; depositing a second dielectric layer on a first portion of the helmet layer; and depositing an etch stop layer on a second portion the helmet layer.

In one embodiment, a method to manufacture an electronic device comprises depositing a helmet layer on a plurality of conductive features on a first dielectric layer on a substrate; depositing a second dielectric layer on a first portion of the helmet layer; and depositing an etch stop layer on a second portion the helmet layer, wherein the thickness of the helmet layer is less than 5 nanometers.

In one embodiment, a method to manufacture an electronic device comprises depositing a helmet layer on a plurality of conductive features on a first dielectric layer on a substrate; depositing a second dielectric layer on a first portion of the helmet layer; and depositing an etch stop layer on a second portion the helmet layer, wherein the helmet layer is deposited by a plasma enhanced chemical vapor deposition (PECVD) technique, a plasma enhanced atomic layer deposition (PEALD) technique, or any combination thereof techniques.

In one embodiment, a method to manufacture an electronic device comprises depositing a helmet layer on a plurality of conductive features on a first dielectric layer on a substrate; depositing a second dielectric layer on a first portion of the helmet layer; and depositing an etch stop layer on a second portion the helmet layer, wherein the helmet layer is free of oxygen.

In one embodiment, a method to manufacture an electronic device comprises depositing a helmet layer on a plurality of conductive features on a first dielectric layer on a substrate; depositing a second dielectric layer on a first portion of the helmet layer; and depositing an etch stop layer on a second portion the helmet layer, wherein the helmet layer comprises silicon, carbon, nitride, and hydrogen.

In one embodiment, a method to manufacture an electronic device comprises depositing a helmet layer on a plurality of conductive features on a first dielectric layer on a substrate; depositing a second dielectric layer on a first portion of the helmet layer; recessing the second dielectric layer; depositing a screen layer on the recessed second dielectric layer; removing the second dielectric layer through the screen layer to form an air gap; stuffing the screen layer, and depositing an etch stop layer on a second portion the helmet layer.

In one embodiment, a method to manufacture an electronic device comprises depositing a helmet layer on a plurality of conductive features on a first dielectric layer on a substrate; depositing a second dielectric layer on a first portion of the helmet layer; recessing the second dielectric layer; depositing a screen layer on the recessed second dielectric layer; removing the second dielectric layer through the screen layer to form an air gap; stuffing the screen layer, removing a portion of the stuffed screen layer to expose at least the second portion of the helmet layer; and depositing an etch stop layer on a second portion the helmet layer and on the stuffed screen layer.

In one embodiment, a method to manufacture an electronic device comprises depositing a helmet layer on a plurality of conductive features on a first dielectric layer on a substrate; depositing a second dielectric layer on a first portion of the helmet layer; curing the second dielectric layer; and depositing an etch stop layer on a second portion the helmet layer.

In one embodiment, a method to manufacture an electronic device comprises depositing a helmet layer on a plurality of conductive features on a first dielectric layer on a substrate; depositing a second dielectric layer on a first portion of the helmet layer; depositing an etch stop layer on a second portion the helmet layer; and depositing an interconnect layer on the etch stop layer.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; and removing the second dielectric layer through the screen layer for form an air gap.

In one embodiment, a method to provide a maskless air gap flow, comprises etching a trench in a first dielectric layer between conductive features on a substrate; depositing a helmet layer on the trench and the conductive features; depositing a second dielectric layer on the helmet layer on the trench; recessing the second dielectric layer; depositing a screen layer on the recessed second dielectric layer; and removing the second dielectric layer through the screen layer for form an air gap.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; removing the second dielectric layer through the screen layer for form an air gap; stuffing the screen layer; and depositing an etch stop layer on the stuffed screen layer.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; removing the second dielectric layer through the screen layer for form an air gap; stuffing the screen layer; depositing an etch stop layer on the stuffed screen layer; and depositing an interconnect layer on the etch stop layer.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; removing the second dielectric layer through the screen layer for form an air gap; removing a portion the screen layer to expose a portion of the helmet layer on the conductive features.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; and removing the second dielectric layer through the screen layer for form an air gap, wherein the thickness of the helmet layer is less than 5 nanometers.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; and removing the second dielectric layer through the screen layer for form an air gap, wherein the helmet layer is deposited by a plasma enhanced chemical vapor deposition (PECVD) technique, a plasma enhanced atomic layer deposition (PEALD) technique, or any combination thereof techniques.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; and removing the second dielectric layer through the screen layer for form an air gap, wherein the helmet layer is free of oxygen.

In one embodiment, a method to provide a maskless air gap flow comprises etching a trench in a first dielectric layer between conductive features on a substrate; depositing a helmet layer on the trench and the conductive features; depositing a second dielectric layer on the helmet layer on the trench; depositing a screen layer on the second dielectric layer; and removing the second dielectric layer through the screen layer for form an air gap, wherein the helmet layer comprises silicon, carbon, nitride, and hydrogen.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; and depositing an etch stop layer on the second dielectric layer.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; and depositing an etch stop layer on the second dielectric layer, wherein the thickness of the helmet layer is less than 5 nanometers.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; and depositing an etch stop layer on the second dielectric layer, wherein the helmet layer is deposited by a plasma enhanced chemical vapor deposition (PECVD) technique, a plasma enhanced atomic layer deposition (PEALD) technique, or any combination thereof techniques.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; and depositing an etch stop layer on the second dielectric layer, wherein the helmet layer is free of oxygen.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; and depositing an etch stop layer on the second dielectric layer, wherein the helmet layer comprises silicon, carbon, nitride, and hydrogen.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; curing the second dielectric layer; removing a portion of the cured second dielectric layer to expose a portion of the helmet layer, and depositing an etch stop layer on the exposed portion of the helmet layer.

In one embodiment, a method to provide a replacement interlayer dielectric flow comprises etching a trench in a first dielectric layer between conductive features on a substrate; depositing a helmet layer on the trench and the conductive features; depositing a second dielectric layer on the helmet layer; depositing an etch stop layer on the second dielectric layer; and depositing an interconnect layer on the etch stop layer.

In one embodiment, an electronic device comprises a helmet layer on a plurality of conductive features on a first dielectric layer on a substrate; a second dielectric layer on a first portion of the helmet layer on a trench between at least two of the conductive features; and an etch stop layer on a second portion the helmet layer.

In one embodiment, an electronic device comprises a helmet layer on a plurality of conductive features on a first dielectric layer on a substrate; a second dielectric layer on a first portion of the helmet layer on a trench between at least two of the conductive features; and an etch stop layer on a second portion the helmet layer, wherein the second portion is on a top portion of the at least two of the conductive features.

In one embodiment, an electronic device comprises a helmet layer on a plurality of conductive features on a first dielectric layer on a substrate; a second dielectric layer on a first portion of the helmet layer on a trench between at least two of the conductive features; and an etch stop layer on a second portion the helmet layer, wherein the thickness of the helmet layer is less than 5 nanometers.

In one embodiment, an electronic device comprises a helmet layer on a plurality of conductive features on a first dielectric layer on a substrate; a second dielectric layer on a first portion of the helmet layer on a trench between at least two of the conductive features; and an etch stop layer on a second portion the helmet layer, wherein the helmet layer is free of oxygen.

In one embodiment, an electronic device comprises a helmet layer on a plurality of conductive features on a first dielectric layer on a substrate; a second dielectric layer on a first portion of the helmet layer on a trench between at least two of the conductive features; and an etch stop layer on a second portion the helmet layer, wherein the helmet layer comprises silicon, carbon, nitride, and hydrogen.

In one embodiment, an electronic device comprises a helmet layer on a plurality of conductive features on a first dielectric layer on a substrate; a second dielectric layer on a first portion of the helmet layer on a trench between at least two of the conductive features; an etch stop layer on a second portion the helmet layer; and an interconnect layer on the etch stop layer.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; and an air gap adjacent to the first portion of the helmet layer.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; and an air gap adjacent to the first portion of the helmet layer; a screen layer over the air gap; and an etch stop layer on the screen layer.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; and an air gap adjacent to the first portion of the helmet layer, wherein the thickness of the helmet layer is less than 5 nanometers.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; and an air gap adjacent to the first portion of the helmet layer, wherein the helmet layer is free of oxygen.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; and an air gap adjacent to the first portion of the helmet layer, wherein the helmet layer comprises silicon, carbon, nitride, and hydrogen.

In one embodiment, an electronic device comprises a trench in a first dielectric layer between conductive features on a substrate, wherein the trench comprises a bottom portion and first opposing sidewalls, and wherein each of the conductive features comprises a top portion and second opposing sidewalls; a helmet layer comprising a first portion and a second portion, wherein the first portion is on the bottom portion and the first opposing sidewalls, and wherein the second portion is on the top portion and the second opposing sidewalls; an air gap adjacent to the first portion of the helmet layer; and an interconnect layer over the air gap.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. A method to manufacture an electronic device, comprising:
   depositing a helmet layer on a plurality of conductive features on a first dielectric layer on a substrate;
   depositing a second dielectric layer on a first portion of the helmet layer; and
   depositing an etch stop layer on a second portion of the helmet layer, wherein the etch stop layer comprises a dielectric material.

2. The method of claim 1, further comprising forming a trench in the first dielectric layer between at least two of the conductive features, wherein the helmet layer is deposited on the trench and on a top portion and opposing sidewalls of the at least two of the conductive features.

3. The method of claim 1, wherein the helmet layer is deposited by a plasma enhanced chemical vapor deposition (PECVD) technique, a plasma enhanced atomic layer deposition (PEALD) technique, or any combination thereof techniques.

4. The method of claim 1, further comprising:
   recessing the second dielectric layer;
   depositing a screen layer on the recessed second dielectric layer;
   removing the second dielectric layer through the screen layer to form an air gap; and
   stuffing the screen layer.

5. The method of claim 1, further comprising curing the second dielectric layer.

6. A method to provide a maskless air gap flow, comprising:
   etching a trench in a first dielectric layer between conductive features on a substrate, the trench having a bottom below a bottom of the conductive features;
   depositing a helmet layer on the trench and the conductive features, the helmet layer directly on the conductive features;
   depositing a second dielectric layer on the helmet layer on the trench;
   depositing a screen layer on the second dielectric layer; and
   removing the second dielectric layer through the screen layer for form an air gap.

7. The method of claim 6, further comprising recessing the second dielectric layer, wherein the screen layer is deposited on the recessed second dielectric layer.

8. The method of claim 6, further comprising stuffing the screen layer; and depositing an etch stop layer on the screen layer.

9. The method of claim 6, wherein the helmet layer is deposited by a plasma enhanced chemical vapor deposition (PECVD) technique, a plasma enhanced atomic layer deposition (PEALD) technique, or any combination thereof techniques.

10. The method of claim 6, wherein the helmet layer is free of oxygen.

11. A method to provide a replacement interlayer dielectric flow, comprising:
    etching a trench in a first dielectric layer between conductive features on a substrate, the trench having a bottom below a bottom of the conductive features;
    depositing a helmet layer on the trench and the conductive features, the helmet layer directly on the conductive features;
    depositing a second dielectric layer on the helmet layer; and
    depositing an etch stop layer on the second dielectric layer.

12. The method of claim 11, wherein the helmet layer is deposited by a plasma enhanced chemical vapor deposition (PECVD) technique, a plasma enhanced atomic layer deposition (PEALD) technique, or any combination thereof techniques.

13. The method of claim 11, wherein the helmet layer is free of oxygen.

14. The method of claim 11, further comprising curing the second dielectric layer, and removing a portion of the cured second dielectric layer to expose a portion of the helmet layer, wherein the etch stop layer is deposited on the portion of the helmet layer.

15. The method of claim 11, further comprising depositing an interconnect layer on the etch stop layer.

16. An electronic device, comprising a helmet layer on a plurality of conductive features on a first dielectric layer on a substrate;
    a second dielectric layer on a first portion of the helmet layer on a trench between at least two of the conductive features; and
    an etch stop layer on a second portion of the helmet layer, wherein the etch stop layer comprises a dielectric material.

17. The electronic device of claim 16, wherein the second portion is on a top portion of the at least two of the conductive features.

18. The electronic device of claim 16, wherein the thickness of the helmet layer is less than 5 nanometers.

19. The electronic device of claim 16, wherein the helmet layer is free of oxygen.

20. The electronic device of claim 16, further comprising an interconnect layer on the etch stop layer.

* * * * *